United States Patent
Wu et al.

(10) Patent No.: US 8,237,263 B2
(45) Date of Patent: Aug. 7, 2012

(54) METHOD AND APPARATUS FOR COOLING AN INTEGRATED CIRCUIT

(75) Inventors: Ting-Hau Wu, Yilan (TW); Chun-Ren Cheng, Hsin-Chu (TW); Chun-Wen Cheng, Zhubei (TW); Jiou-Kang Lee, Zhubei (TW); Jung-Huei Peng, Jhubei (TW); Shang-Ying Tsai, Jhongli (TW); Te-Hsi Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 309 days.

(21) Appl. No.: 12/651,002

(22) Filed: Dec. 31, 2009

(65) Prior Publication Data

US 2011/0156245 A1    Jun. 30, 2011

(51) Int. Cl.
*H01L 23/34* (2006.01)
(52) U.S. Cl. ... 257/714; 257/715; 257/777; 257/E23.08; 257/E23.097; 438/122
(58) Field of Classification Search .......... 257/712–722, 257/E21.499, 276, 625, 675, 706, 707, 796, 257/E33.075, E31.131, E23.08–E23.113, 257/777; 438/122, FOR. 366; 165/104.19–104.22
See application file for complete search history.

(56) References Cited

U.S. PATENT DOCUMENTS

| | | | |
|---|---|---|---|
| 5,349,237 A | 9/1994 | Sayka et al. | |
| 6,228,744 B1 | 5/2001 | Levine et al. | |
| 6,629,425 B2 | 10/2003 | Vaiyapuri | |
| 6,847,114 B2 | 1/2005 | Sett et al. | |
| 6,934,514 B2 | 8/2005 | Stenberg | |
| 7,569,426 B2 * | 8/2009 | Myers et al. | 438/122 |

* cited by examiner

*Primary Examiner* — Jasmine Clark
(74) *Attorney, Agent, or Firm* — Haynes and Boone, LLP

(57) ABSTRACT

An integrated circuit, a method of operating the integrated circuit, and a method of fabricating the integrated circuit are disclosed. According to one of the broader forms of the invention, a method and apparatus involve an integrated circuit that includes a heat transfer structure having a chamber that has a fluid disposed therein and that extends between a heat generating portion and a heat absorbing portion. Heat is absorbed into the fluid from the heat generating portion, and the fluid changes from a first phase to a second phase different from the first phase when the heat is absorbed. Heat is released from the fluid to the heat absorbing portion, and the fluid changes from the second phase to the first phase when the heat is released.

22 Claims, 15 Drawing Sheets

METHOD AND APPARATUS FOR COOLING AN INTEGRATED CIRCUIT

BACKGROUND

The present disclosure relates generally to integrated circuit devices and methods for manufacturing integrated circuit devices, and more particularly, to heat transferring mechanisms for integrated circuit devices and methods for manufacturing the same.

Integrated circuit (IC) devices are known to sometimes generate a substantial amount of heat, which can adversely effect IC device reliability and functionality. Various approaches have been implemented to remove heat from active areas of IC devices (such as portions of the IC devices having microelectronic elements and/or microelectromechanical (MEMS) devices). For example, a silicon buck is currently used to remove heat from areas of an IC device that include MEMS devices. Although existing approaches to removing heat from IC devices have been generally adequate for their intended purposes, they have not been entirely satisfactory in all respects.

SUMMARY

The present disclosure provides for many different embodiments. According to one of the broader forms of the invention, an apparatus includes: an integrated circuit including a heat generating portion, a heat absorbing portion spaced from the heat generating portion, and heat transfer structure that transfers heat from the heat generating portion to the heat absorbing portion, wherein the heat transfer structure includes: a chamber extending between the heat generating and heat absorbing portions; and a fluid disposed within the chamber and having first and second phases that are different, the fluid having a first phase change characteristic where a change from the first phase to the second phase occurs upon heat absorption from the heat generating portion, and having a second phase change characteristic where a change from the second phase to the first phase occurs upon release of heat to the heat absorbing portion.

According to another of the broader forms of the invention, a method of operating an integrated circuit that includes a heat transfer structure having a chamber that has a fluid disposed therein and that extends between a heat generating portion and a heat absorbing portion, the method including: absorbing heat into the fluid from the heat generating portion, the fluid changing from a first phase to a second phase different from the first phase when the heat is absorbed; and releasing heat from the fluid to the heat absorbing portion, the fluid changing from the second phase to the first phase when the heat is released.

According to another of the broader forms of the invention, a method includes: forming a first structure on a first part; forming a second structure on a second part; bonding the first and second parts to form a portion of an integrated circuit, such that the first and second structures are adjacent and collectively form a chamber within the integrated circuit; forming a heat generating portion and a heat absorbing portion in the integrated circuit, the heat generating and heat absorbing portions being spaced from each other and each being proximate to the chamber; and introducing into the chamber a fluid having first and second phases that are different, the fluid having a first phase change characteristic where a change from the first phase to the second phase occurs upon heat absorption from the heat generating portion, and having a second phase change characteristic where a change from the second phase to the first phase occurs upon release of heat to the heat absorbing portion.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
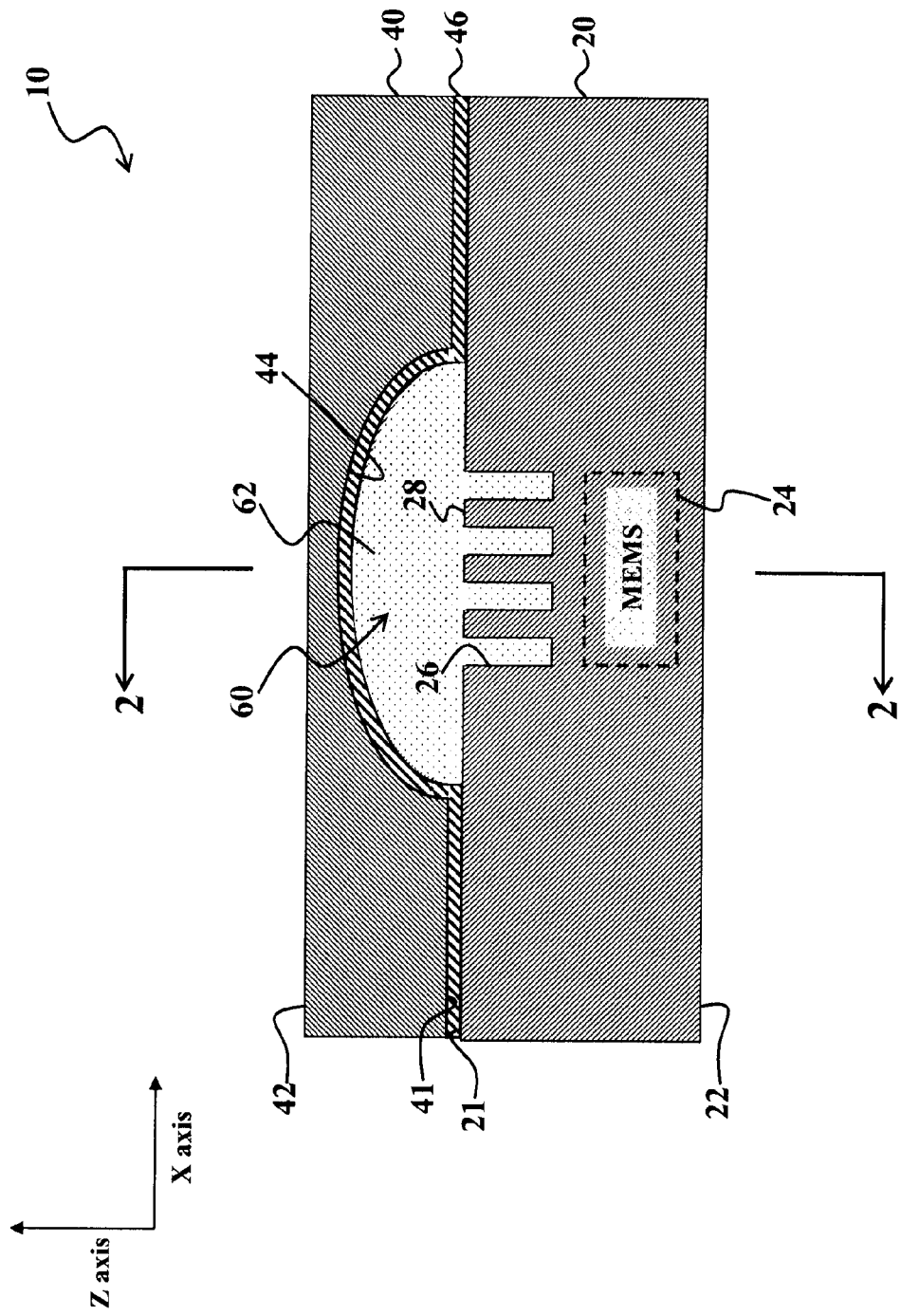
FIG. 1 is a diagrammatic cross-sectional side view of an integrated circuit.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

Figure 2:
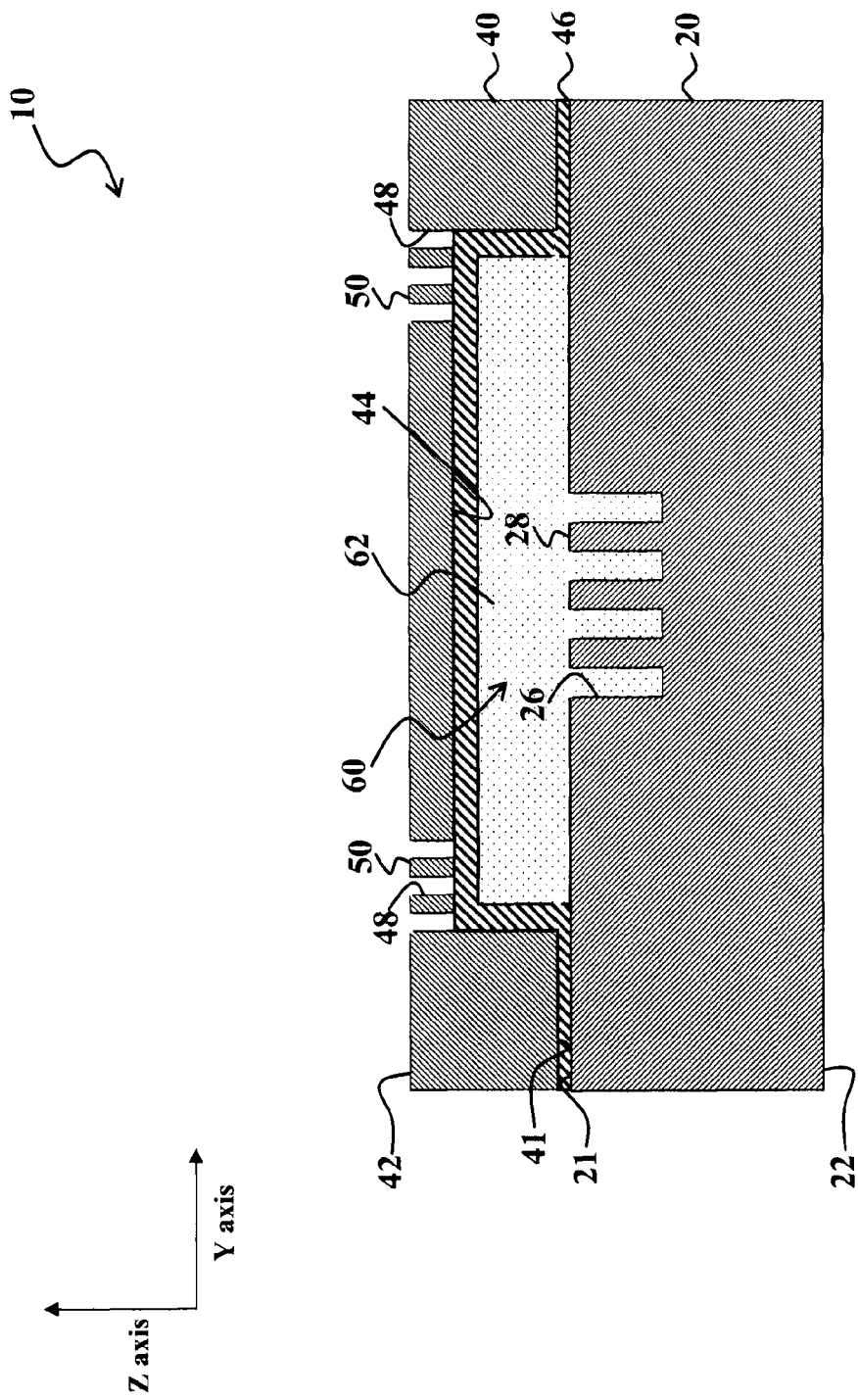
FIG. 2 is a diagrammatic sectional side view of the integrated circuit taken along line 2-2 in FIG. 1.

FIG. 1 is a diagrammatic sectional side view of an integrated circuit 10, and FIG. 2 is a diagrammatic sectional side view taken along line 2-2 in FIG. 1. The integrated circuit 10 includes a substrate 20 having a top surface 21 and a bottom surface 22. The substrate 20 is a semiconductor substrate including silicon. Alternatively, the semiconductor substrate could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 20 includes various layers that are not separately depicted and that can combine to form various microelectronic elements that may include: transistors (for example, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The various layers may include high-k dielectric layers, gate layers, hard mask layers, interfacial layers, capping layers, diffusion/barrier layers, dielectric layers, conductive layers, other suitable layers, or combinations thereof. The microelectronic elements could be interconnected to one another to form a portion of the integrated circuit 10, such as a logic device, memory device (for example, a static random access memory (SRAM)), radio frequency (RF) device, input/output (I/O) device, system-on-chip (SoC) device, other suitable types of devices, or combinations thereof.

In the present embodiment, the substrate 20 also includes a microelectromechanical system (MEMS) device 24. The MEMS device 24 is a MEMS device of a known type, such as a motion sensor (for example, a gyroscope or an accelerometer). Alternatively, the MEMS device could be a RF MEMS device (for example, an RF switch or filter), an oscillator, a MEMS microphone, and/or any other MEMS type device, including future MEMS type devices. One of ordinary skill in the art will recognize that the MEMS device 24 could alternatively include nanoelectromechanical elements, for example, the MEMS device could alternatively be a nanoelectromechanical system (NEMS) device. Where the substrate includes various microelectronic elements, the MEMS device 24 could be interconnected to the microelectronic elements. The MEMS device 24 generates heat when it operates.

The substrate 20 includes a recess surface that defines a recess 26. The recess 26 is proximate to the MEMS device 24. The recess 26 has a high aspect ratio and extends away from the top surface 21 of the substrate 20. In the disclosed embodiment, the recess 26 extends about 100 μm to about 300 μm into the substrate 20 from the top surface 21.

Multiple heat transfer projections 28 extend from the substrate 20 into the recess 26. The projections 28 extend the entire depth of the recess 26, for example, from about 100 μm to about 300 μm from the substrate 20 into the recess 26. In the present example, each projection 28 is a portion of the substrate 20, and thus includes silicon. Alternatively, each projection 28 could include other materials. The projections 28 are arranged in rows and columns, such that an array of the projections 28 extends into the recess 26.

Figure 5:
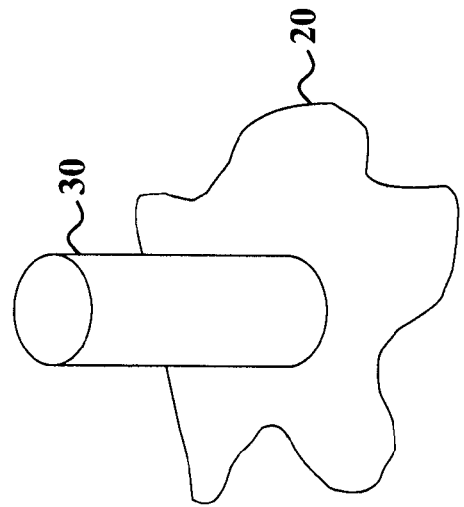
FIGS. 4 and 5 are diagrammatic fragmentary perspective views showing projections that are alternative embodiments of the projections of FIG. 3.
Figure 4:
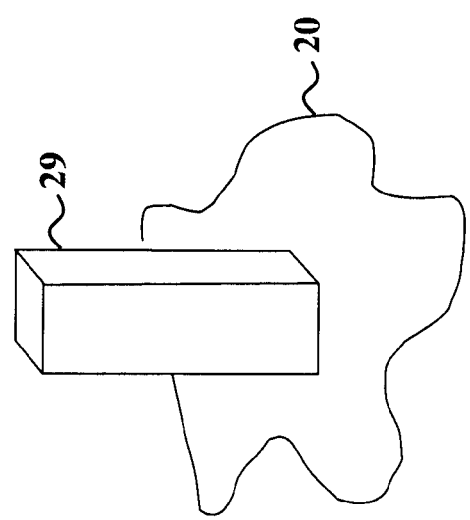
Figure 3:
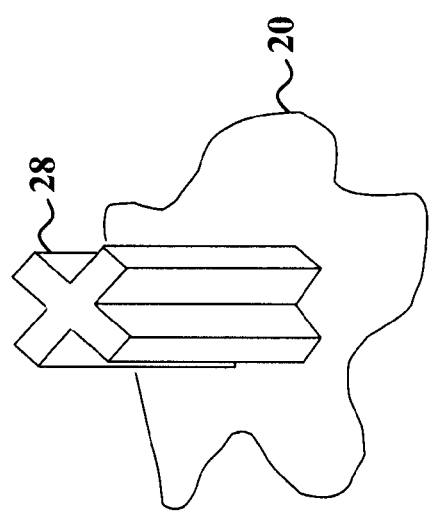
FIG. 3 is a diagrammatic fragmentary perspective view showing one of multiple projections included in the integrated circuit of FIG. 1.

FIG. 3 is a diagrammatic fragmentary perspective view of one of the projections 28, which illustrates that each projection 28 has a cross-shaped cross-section. FIGS. 4 and 5 are diagrammatic fragmentary perspective views showing projections that are alternative embodiments of the projections 28 of FIG. 3. For example, alternatively, a projection 29 could have a rectangular cross-section as illustrated in FIG. 4, or a projection 30 could have a cylindrical cross-section as illustrated in FIG. 5. The illustrated cross-sections for the projections 28, 29, and 30 are not intended to be limiting, and it is understood that any appropriately shaped projection is contemplated by the present disclosure. Further, where there is an array of projections 28, as in the present embodiment, the array of projections could alternatively include projections with different shapes.

Referring to FIGS. 1 and 2, the integrated circuit 10 also includes another substrate 40 having a bottom surface 41 and a top surface 42. The substrate 40 is a semiconductor substrate including silicon. Alternatively, this semiconductor substrate could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 40 can include various layers that are not separately depicted, such as high-k dielectric layers, gate layers, hard mask layers, interfacial layers, capping layers, diffusion/barrier layers, dielectric layers, conductive layers, other suitable layers, or combinations thereof.

The substrate 40 includes a recess surface that defines a recess 44. The recess 44 extends away from the bottom surface 41 of the substrate 40. In the disclosed embodiment, the recess 44 extends about 200 μm into the substrate 40 from the bottom surface 41. The recess 44 has a semicircular shape as viewed in FIG. 1 and a rectangular shape as viewed in FIG. 2. Other shapes and/or configurations for the recess 44 are contemplated.

A bonding/barrier layer 46 is provided over the bottom surface 41 of the substrate 40 and over the recess surface that defines the recess 44. The bonding/barrier layer 46 includes silicon oxide ($SiO_2$). Alternatively, the bonding/barrier layer 46 could include other materials, such as silicon nitride. In the present embodiment, the bonding/barrier layer 46 has a thickness of about 0.2 μm to about 0.8 μm.

The substrate 40 includes two other recess surfaces that define spaced recesses 48 (FIG. 2). The recesses 48 extend away from the top surface 42 of the substrate 40. The recesses 48 are proximate to, yet free of communication with, the recess 44. The recesses 48 extend, for example, about 70 μm to about 100 μm into the substrate 40 to the bonding/barrier layer 46.

Multiple heat transfer projections 50 extend into the recesses 48. In the present embodiment, the multiple heat transfer projections 50 are supported by the bonding/barrier layer 46. Each projection 50 includes silicon. Alternatively, each projection 50 could include other materials. The structure of the projections 50 is similar to the structure of the projections 28, and so, the projections 50 are cross-shaped projections. Also, similar to the projections 28, the projections 50 are arranged in rows and columns, such that an array of the projections 50 extends into each of the recesses 48.

Referring to FIGS. 1 and 2, the bonding/barrier layer 46, which is in contact with the bottom surface 41 of substrate 40, is also in contact with the top surface 21 of the substrate 20, and effects a fixed coupling of the substrates 20 and 40. In the present example, the bonding/barrier layer 46 effects a fusion bond between substrates 20 and 40. The fusion bonding results from bringing the substrates 20 and 40 into intimate contact, such that the substrates 20 and 40 hold together due to atomic attraction forces (Van der Waal forces). Since the bonding/barrier layer 46 includes silicon oxide ($SiO_2$), the fusion bond arises from $SiO_2/Si$ bonding (for example, contact between the $SiO_2$ barrier/bonding layer 46 and the Si substrates 20 and 40).

After the substrate 20 is coupled to the substrate 40, the recesses 26 and 44 are adjacent and collectively form a chamber 60. The chamber 60 contains a fluid 62, such as water. In the present embodiment, the fluid 62 has a liquid phase and a gas phase. The fluid 62 has a first phase change characteristic where a change from the liquid phase to the gas phase occurs upon heat absorption, and a second phase change characteristic where a change from the gas phase to the liquid phase occurs upon release of heat. The fluid 62 could alternatively have phases other than the liquid and gas phases, and could have other phase change characteristics. The bonding/barrier layer 46 helps prevent the fluid 62 from escaping the chamber 60 or diffusing into other parts of the integrated circuit 10.

An explanation will now be provided of the operation of the integrated circuit 10, which provides for transfer of heat within the integrated circuit 10. In the present example, heat is generated in the substrate 20, for example, by mechanical movement within the MEMS device 24. When microelectronic elements are included in the substrate 20, the microelectronic elements could also generate heat in the substrate 20. This heat from the MEMS device 24 and/or microelectronic elements flows to recess 26, including the heat transfer projections 28 in recess 26.

The fluid 62 contacts portions of the substrate 20, such as the projections 28. Due to a temperature difference between the substrate 20/projections 28 and the fluid 62, heat flows from the substrate 20/projections 28 to the fluid 62. Accordingly, the fluid 62 that is in the liquid state in the recess 26 absorbs heat from the substrate 20/projections 28. Upon absorption of this heat, the fluid 62 vaporizes and thus changes from the liquid phase to the gas phase. In the present example, the projections 28 and their cross-sectional shape increase a surface area that is in contact with the fluid 62, thus increasing the heat exchange area between the substrate 20/projections 28 and the fluid 62, which increases the rate of heat exchange/transfer.

The portion of the fluid 62 in the gas phase flows from the recess 26 through the chamber 60 to portions of the chamber 60 that are proximate to the recesses 48 in the substrate 40. Here, the fluid 62 that is in the gas phase releases heat through the bonding/barrier layer 46. The released heat flows through the bonding/barrier layer 46 and then flows out of the integrated circuit 10 through the recesses 48. The released heat also flows from the bonding/barrier layer 46 to the projections 50 and then out of the integrated circuit 10 through the recesses 48. Upon release of this heat, the fluid 62 condenses and thus changes from the gas phase to the liquid phase. The condensed fluid 62 in the liquid phase flows back toward the recess 26. The fluid 62 cyclically changes between the liquid and gas phases as it absorbs and releases heat within the integrated circuit 10, transferring heat away from the portion of the substrate 20 that includes the MEMS device 24 and/or microelectronic elements. In effect, the chamber 60 and fluid 62 define a heat pipe within integrated circuit 10.

Figure 6:
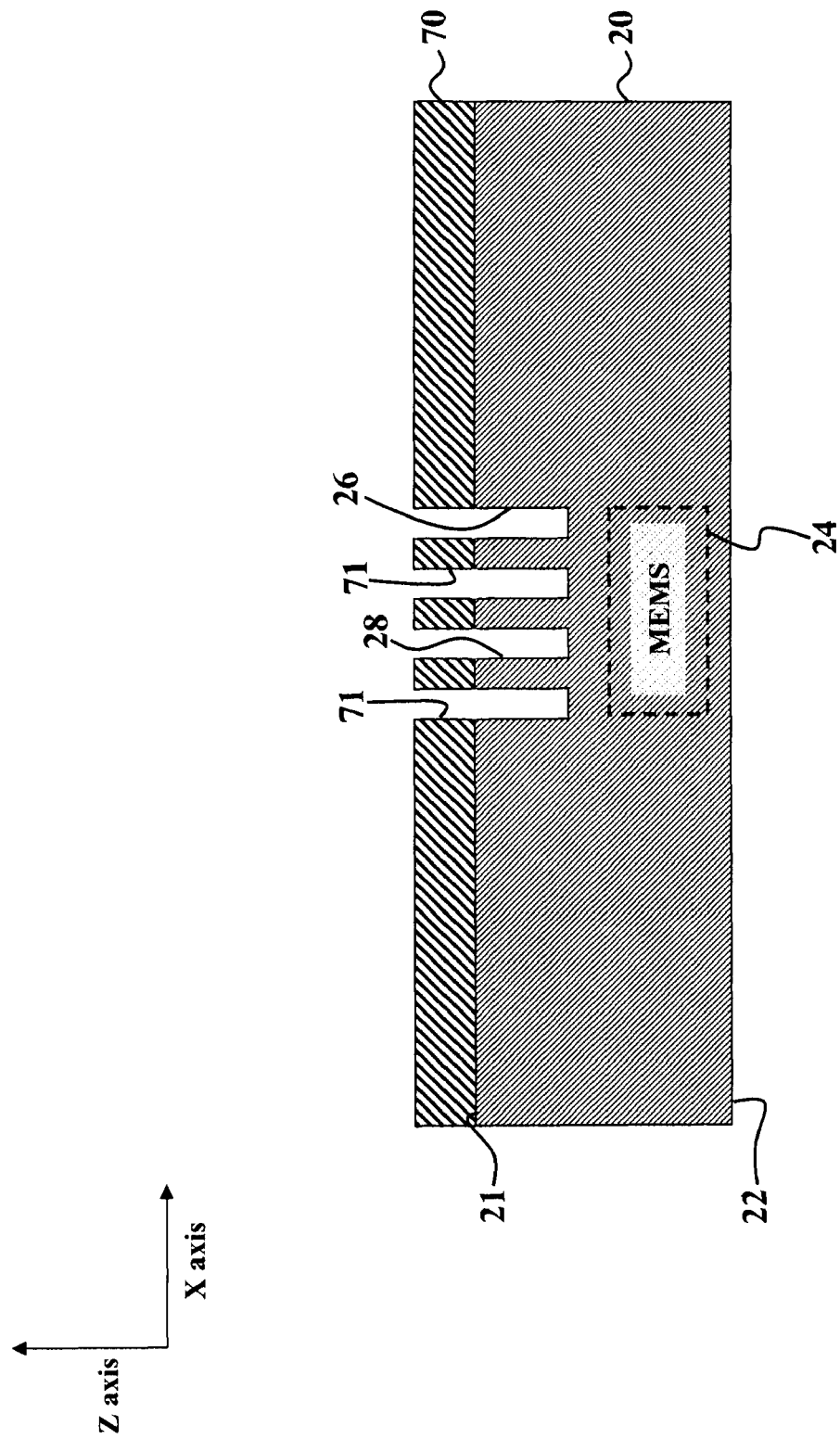
FIGS. 6, 7, and 8 are each a sectional side view showing a portion of the integrated circuit of FIGS. 1 and 2 at respective different stages during fabrication.
Figure 7:
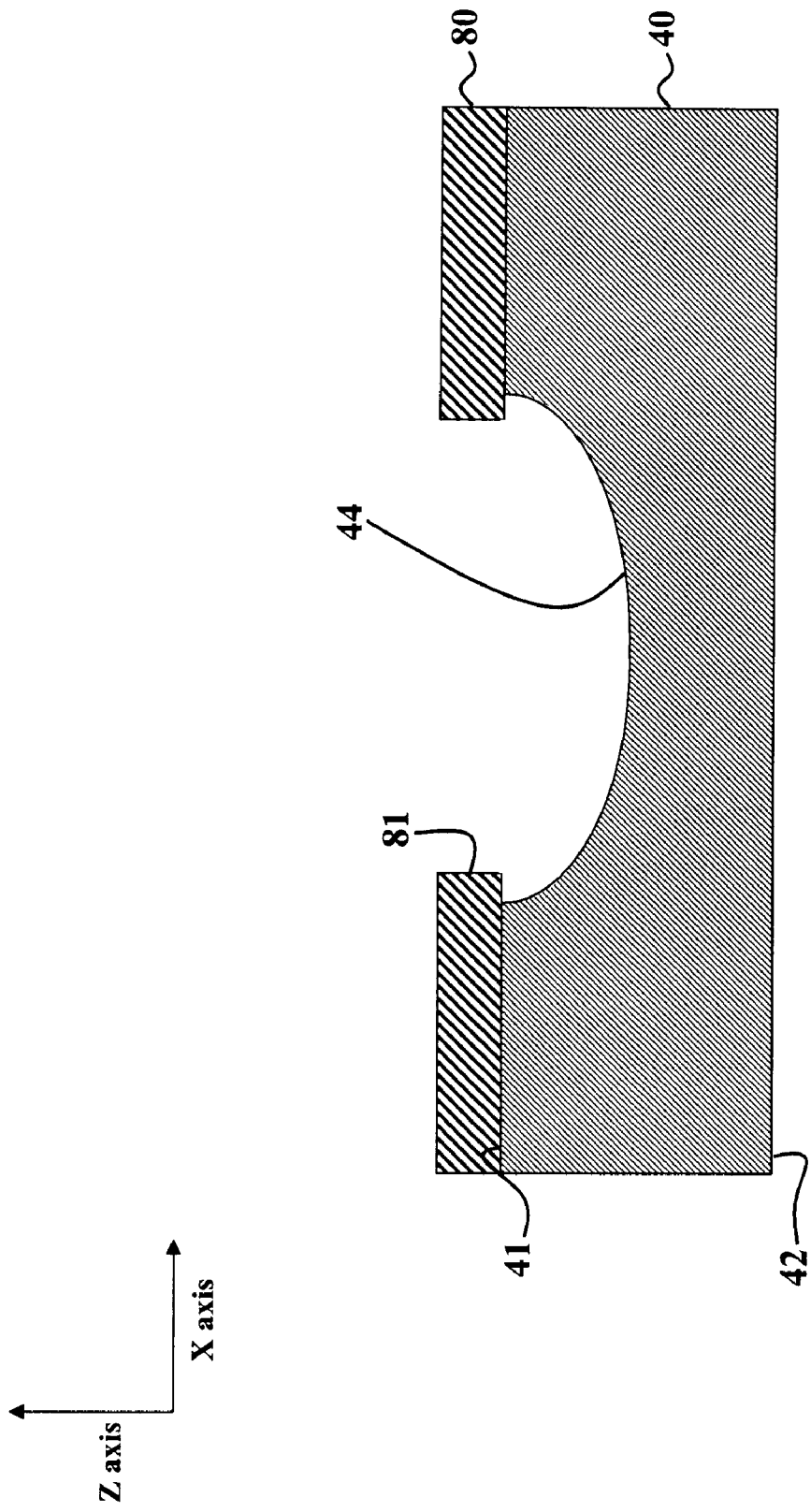
Figure 8:
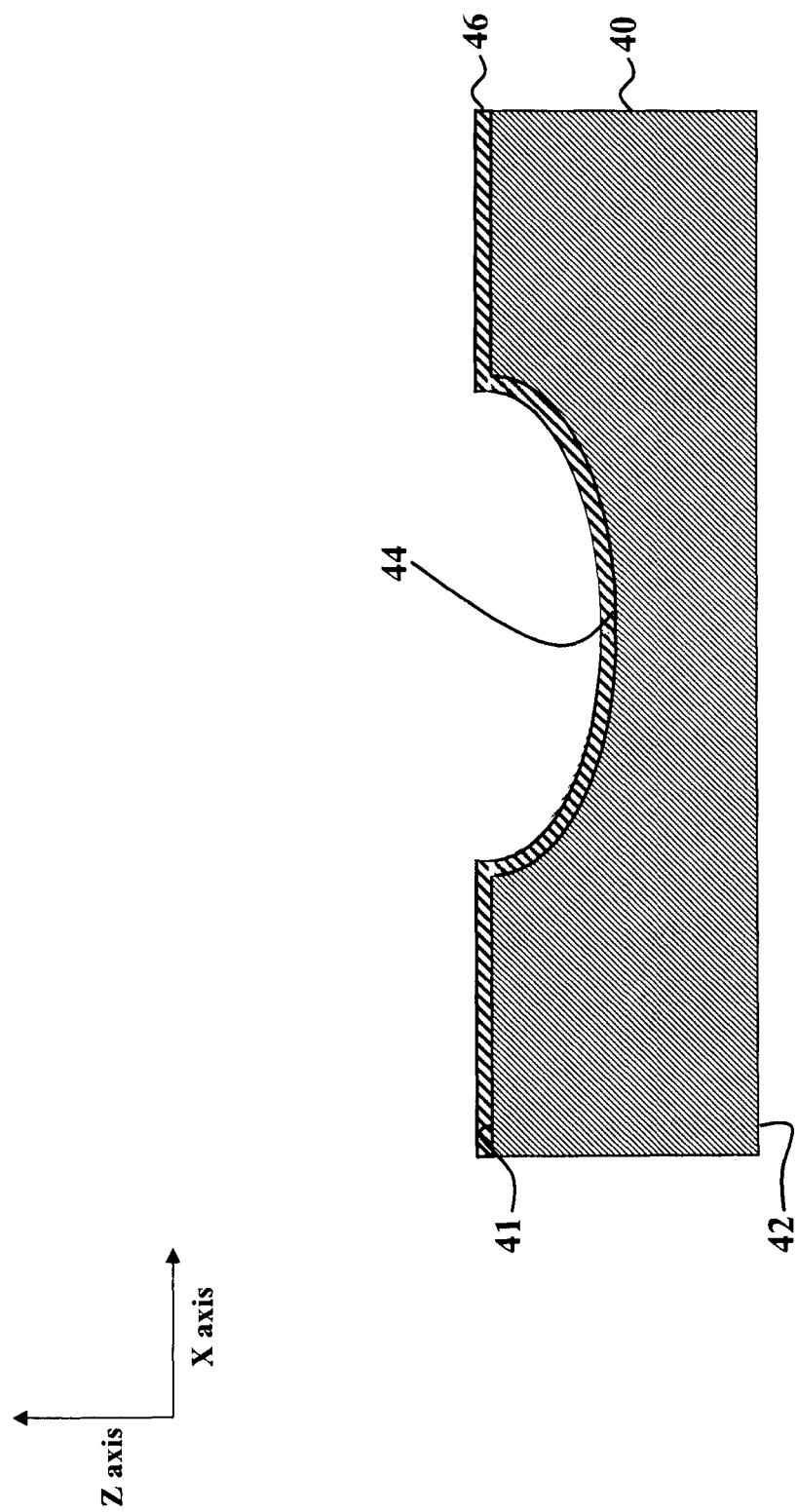

FIGS. 6, 7, and 8 are each a sectional side view showing a portion of the integrated circuit 10 at respective different stages during fabrication. With reference to FIGS. 6, 7, and 8, an explanation will now be provided of a method for fabricating the integrated circuit 10.

Referring to FIG. 6, the substrate 20 is provided, including the MEMS device 24 and electrical circuitry. A photoresist layer 70 is formed over the top surface 21 of the substrate 20. The photoresist layer 70 is made of a known material, and may be applied using a known spin-on coating process. The photoresist layer 70 has a thickness of about 3 μm to about 5 μm. The photoresist layer 70 is then patterned in a known manner to form multiple openings 71 that expose portions of the substrate 20. Patterning can include soft baking, mask aligning, exposure, post-exposure baking, developing the photoresist, rinsing, drying (for example, hard baking), other suitable processes, and/or combinations thereof. Alternatively, the exposure process could be implemented by maskless photolithography, electron-beam writing, and/or ion-beam writing.

The pattern of the photoresist layer 70 is transferred to the substrate 20. This includes removing portions of the substrate 20 that are exposed by the openings 71 in the photoresist layer 70. In the present embodiment, a high aspect ratio etching process, such as a deep reactive ion etching process, removes the exposed portions of the substrate 20 to form the recess surface of substrate 20 that defines the recess 26. The etching process is performed until the recess 26 extends about 100 μm to about 300 μm into the substrate 20 from the top surface 21. Removing the exposed portions of the substrate 20 could be performed by other processes, including dry etching processes, wet etching processes, other etching methods, or combinations thereof. Within the recess 26, several portions of the substrate 20 that are protected from etching by the photoresist layer 70 form the heat transfer projections 28. The thickness of the photoresist 70 can be selected based on a desired depth of the recess 26. Subsequently, the photoresist layer 70 is removed in a known manner, for example, by a photoresist stripping process.

Referring to FIG. 7, the substrate 40 is provided, beginning with a thickness of about 725 μm. The substrate 40 could begin with other thicknesses. The substrate 40 is inverted in FIG. 7, such that the bottom surface 41 is on the top and the top surface 42 is on the bottom. A photoresist layer 80 of a known material is formed over the bottom surface 41 of the substrate 40. The photoresist layer 80 is patterned in a known manner to form an opening 81 that exposes a portion of the substrate 40. The processes used to pattern photoresist layer 80 may be similar to those used to pattern photoresist layer 70. The portion of the substrate 40 that is exposed within the opening 81 is then removed to form the recess surface of the substrate 40 that defines the recess 44. In the present embodiment, a wet etching process removes the exposed portion of the substrate 40 within the opening 81 of the photoresist layer 80. Also in the present embodiment, the etching process is selected to achieve shape for recess 44 that is shown in FIGS. 1 and 2. Alternatively, a dry etching process or combination dry and wet etching process could be utilized to remove the exposed portion of the substrate 40. Subsequently, the photoresist layer 80 is removed, and with reference to FIG. 8, the bonding/barrier layer 46 is formed over the bottom surface 41 of the substrate 40 and over the recess surface that defines the recess 44. The bonding/barrier layer 46 is formed by a high density plasma (HDP) deposition process, but could alternatively be formed by other processes.

Referring to FIGS. 1 and 2, the substrates 20 and 40 are then coupled together with the fluid 62 disposed in the chamber 60. As noted above, in the present embodiment, the bonding/barrier layer 46 effects the coupling between the substrates 20 and 40 via fusion bonding. Alternatively, the bonding/barrier layer 46 could be omitted from the surfaces 21 and 41 of the substrates 20 and 40, and the surface 21 of the substrate 20 and the surface 41 of the substrate 40 could instead be coupled together via a fusion bond resulting from Si/Si bonding (between the Si substrate 20 and the Si substrate 40). The fusion bonding processes can include an annealing process, after which a solid bond is formed between the substrates.

In the present embodiment, after the substrates 20 and 40 have been coupled together, the thickness of the substrate 40 is reduced from the thickness shown in FIGS. 7 and 8 to the thickness shown in FIGS. 1 and 2. More specifically, a wafer grinding process of a known type is applied to the top surface 42 of the substrate 40, such that the distance between the top surface 42 and bottom surface 41 is reduced and the thickness of the substrate 40 is reduced to about 300 μm. Alternatively, the thickness of the substrate 40 may be reduced by other methods. Then, referring to FIG. 2, the top surface 42 of the substrate 40 is subjected to a patterned etch to form the recess surfaces of the substrate 40 that define the recesses 48 and the heat transfer projections 50. This process is similar to the process used to form the recess 26 and projections 28. For example, a patterned photoresist layer is formed over the top surface 42 of the substrate 40. The patterned photoresist layer includes openings that expose portions of the substrate 40, and the exposed portions of the substrate 40 are removed by a known process. In the disclosed embodiment, a high aspect ratio etching process (for example, a deep reactive ion etching process) is performed on the substrate 40 until the bonding/barrier layer 46 is reached, such that the heat transfer projections 50 are formed, and remain supported by bonding/barrier layer 46. It is understood that the recesses 48/projections 50 could alternatively be formed before coupling of the substrates 20 and 40.

Figure 9:
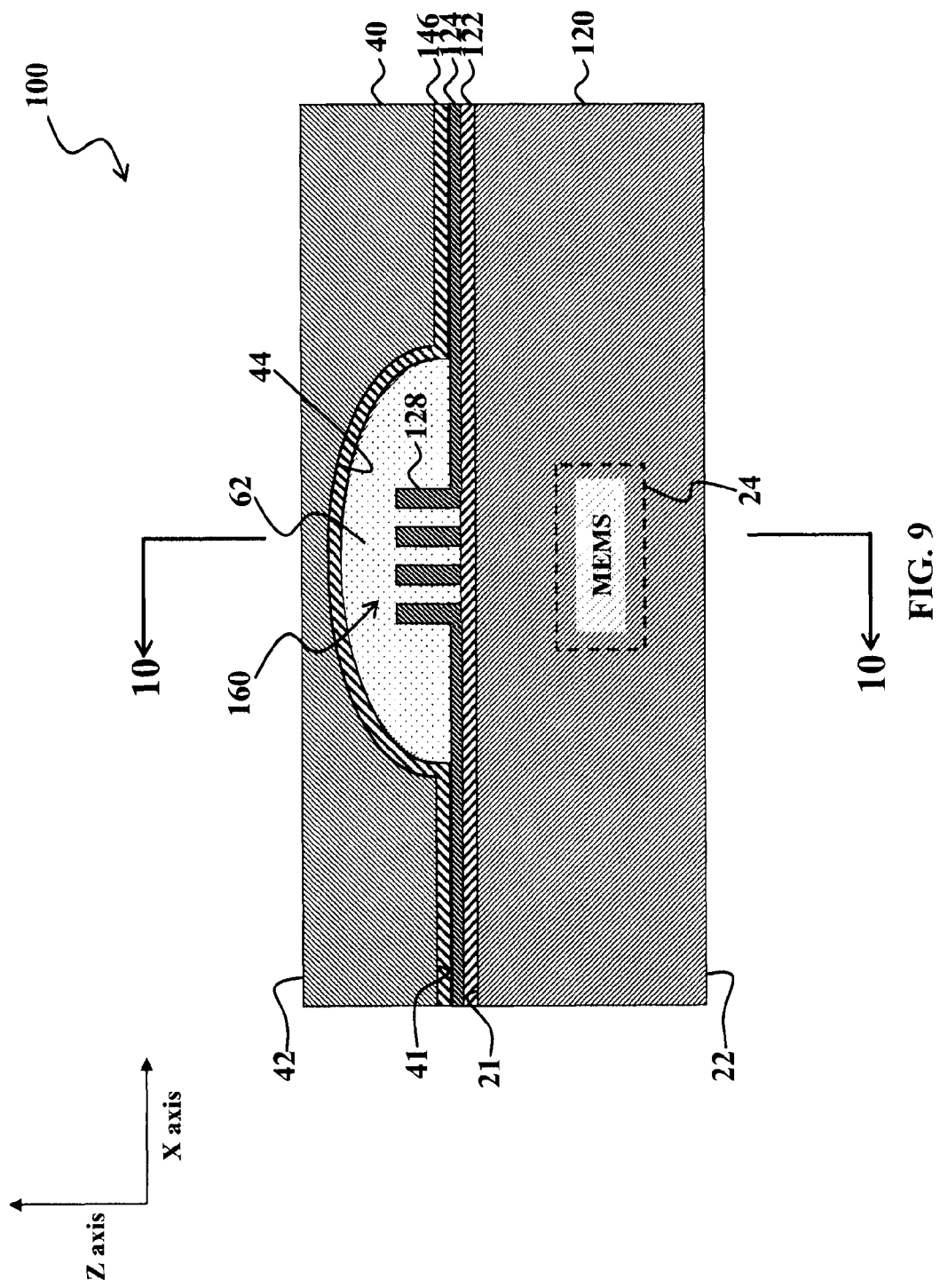
FIG. 9 is a diagrammatic sectional side view of an integrated circuit that is an alternative embodiment of the integrated circuit of FIGS. 1 and 2.
Figure 10:
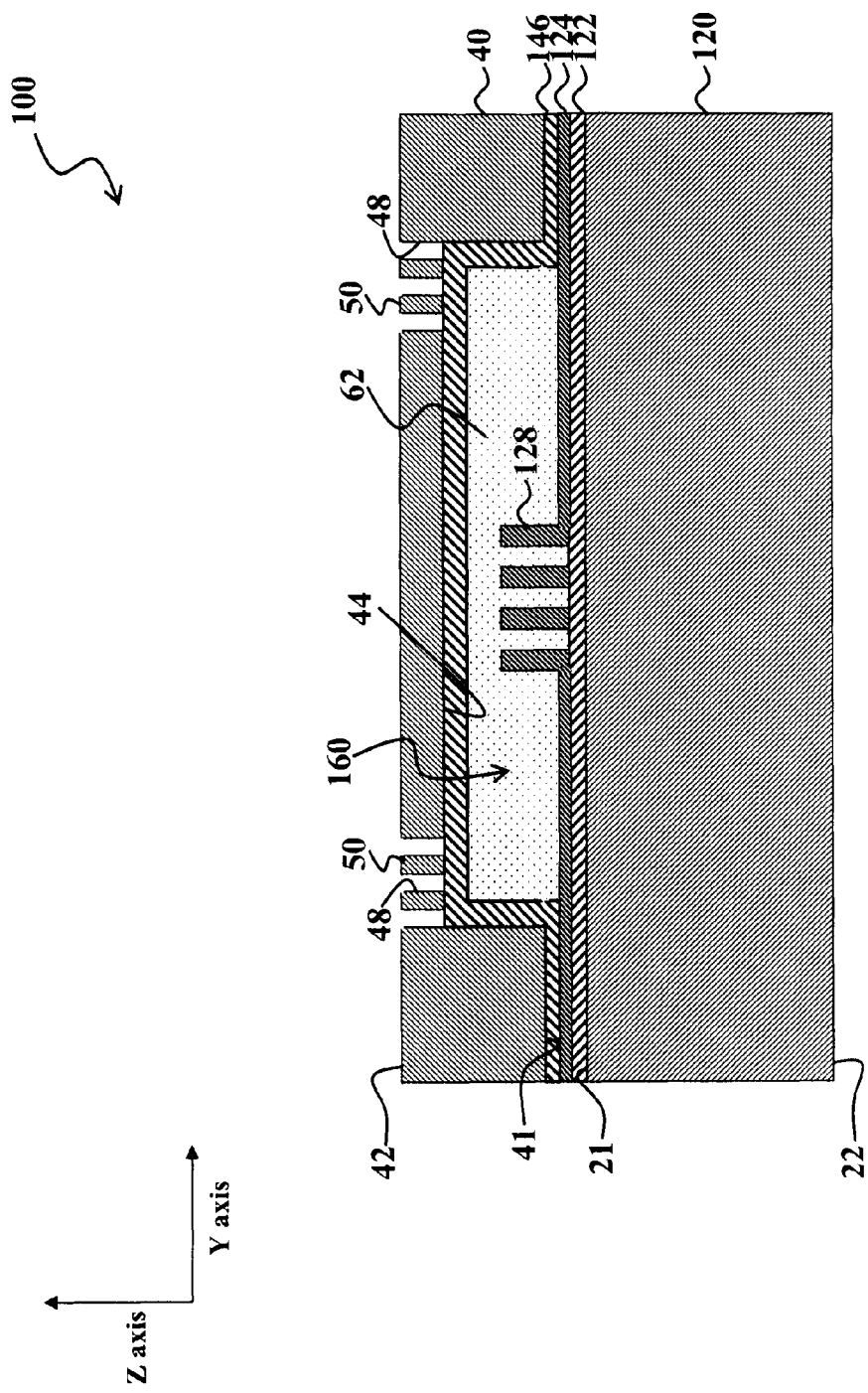
FIG. 10 is a diagrammatic sectional side view of the integrated circuit taken along line 10-10 in FIG. 9.

FIG. 9 is a diagrammatic sectional side view of an integrated circuit 100 that is an alternative embodiment of the integrated circuit 10 of FIG. 1, and FIG. 10 is a diagrammatic sectional side view taken along line 10-10 in FIG. 9. The embodiment of FIGS. 9-10 is similar in many respects to the embodiment of FIGS. 1-2. Accordingly, equivalent parts are identified by the same reference numerals, and the following discussion focuses primarily on the differences.

The integrated circuit 100 includes a substrate 120 that is similar to the substrate 20, except that the substrate 120 does not include the recess 26. A buffer layer 122 is provided over the top surface 21 of the substrate 120. In the present embodiment, the buffer layer 122 is a pad oxide layer. The pad oxide layer includes silicon oxide ($SiO_2$). The buffer layer 122 could alternatively include other materials. The buffer layer 122 protects the top surface 21 of the substrate 120.

A conductive layer 124 is provided over the buffer layer 122. The conductive layer includes a metal material, and in the disclosed embodiment, includes aluminum (Al). Alternatively, the conductive layer 124 could include other materials (for example, gold (Au) and/or copper (Cu)). A portion of the conductive layer 124 includes heat transfer projections 128. The shape of the projections 128 is similar to the shape of the projections 28, and so, the projections 128 have cross-shaped cross-sections. Also, similar to the projections 28, the projections 128 are arranged in rows and columns, such that an array of the projections extends from the buffer layer 122.

Similar to the bonding/barrier layer 46, a bonding/barrier layer 146 is provided over the bottom surface 41 of the substrate 40 and the recess surface on the substrate 40 that defines the recess 44. The bonding/barrier layer 146 includes a metal material, such as AlCu, with a thickness of about 5 μm. The bonding/barrier layer 146 could alternatively include other materials and/or have other thicknesses. The bonding/barrier layer 146 is also in contact with the conductive layer 124, and cooperates with conductive layer 124 to effect coupling of the substrates 120 and 40. In the present example, the bonding/barrier layer 146 effects a eutectic bond with conductive layer 124. A eutectic bond is formed by heating two (or more) materials that are in contact such that the two (or more) materials diffuse together to form an alloy composition. Since the bonding/barrier layer 146 and the conductive layer 124 include metal materials (for example, AlCu and Al), the eutectic bond arises from metal/metal bonding (Al/Al bonding). Alternatively, by using different materials, the eutectic bonding process could result from metal/semiconductor bonding, such as Ge/Al bonding, Ge/Au bonding, Si/Au bonding, Si/Al bonding, and/or other suitable bonding.

As illustrated in FIGS. 9 and 10, after the substrate 120 is coupled to the substrate 40, the recess 44 forms a chamber 160 that contains the fluid 62, and the bonding/barrier layer 146 helps prevent the fluid 62 from escaping the chamber 160 or diffusing into other parts of the integrated circuit 100. Also, in the disclosed embodiment, the projections 128 extend from the buffer layer 122 into the chamber 160.

The operation of the integrated circuit 100 is similar to the operation of the integrated circuit 10 and provides for transfer of heat within the integrated circuit 100. Heat is generated in the substrate 120, for example, by mechanical movement within the MEMS device 24. The heat flows in the substrate 120 to the buffer layer 122 and the conductive layer 124 that includes the heat transfer projections 128. The fluid 62 contacts portions of the projections 128. Due to a temperature difference between the projections 128 and the fluid 62, heat flows from the conductive layer 124/projections 128 to the fluid 62. From there, the integrated circuit 100 operates substantially similar to the integrated circuit 10, the fluid 62 cyclically changing between the liquid and gas phases as it absorbs and releases heat within the integrated circuit 100. In addition, similar to integrated circuit 10, the chamber 160 and fluid 62 of integrated circuit 100 effectively define a heat pipe within the integrated circuit 100, transferring heat away from the portion of the substrate 120 that generates heat (for example, the MEMS device 24 and/or microelectronic elements).

Figure 11:
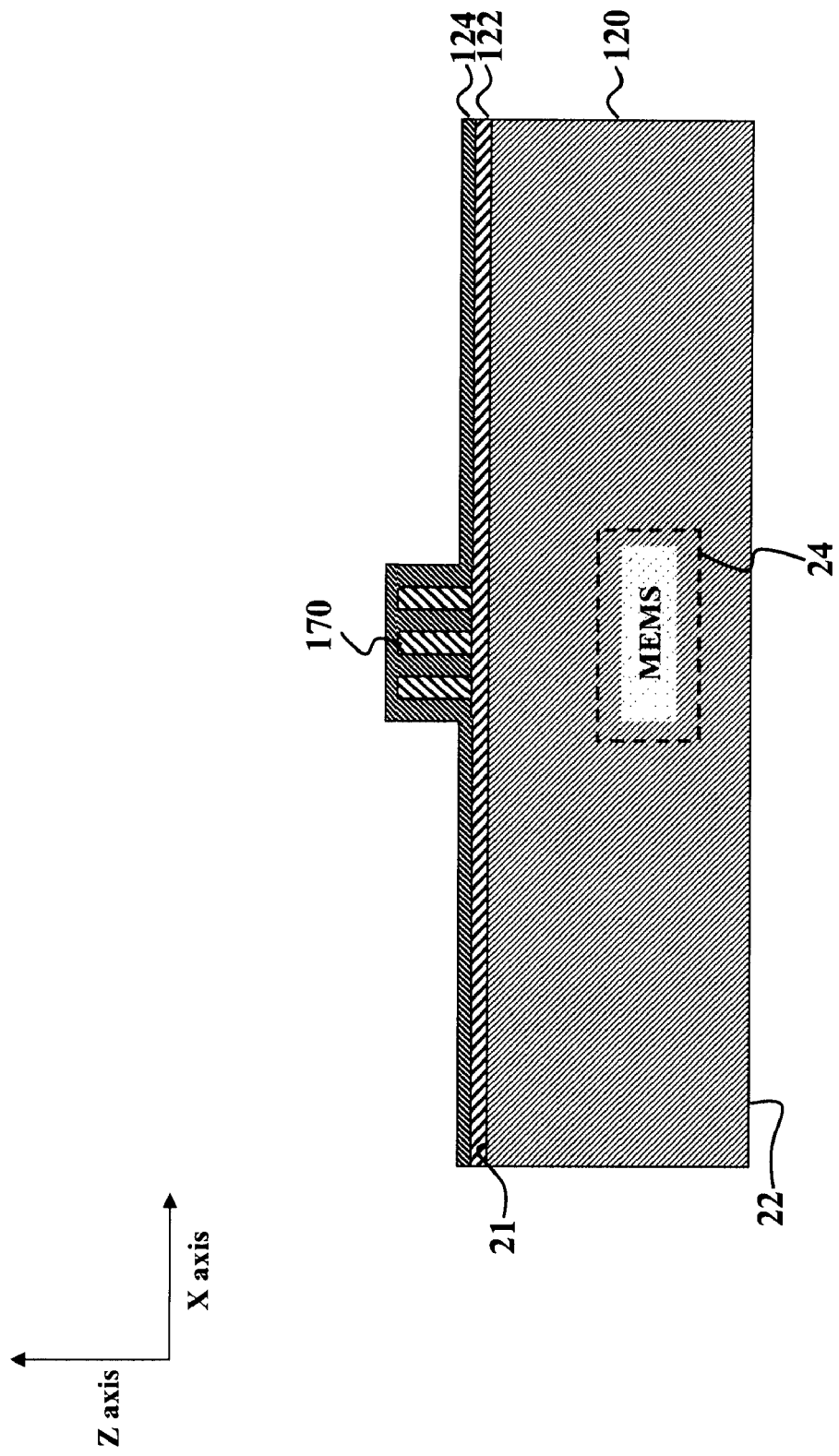
FIGS. 11, 12, and 13 are each a sectional side view showing a portion of the integrated circuit of FIGS. 9 and 10 at respective different stages during fabrication
Figure 12:
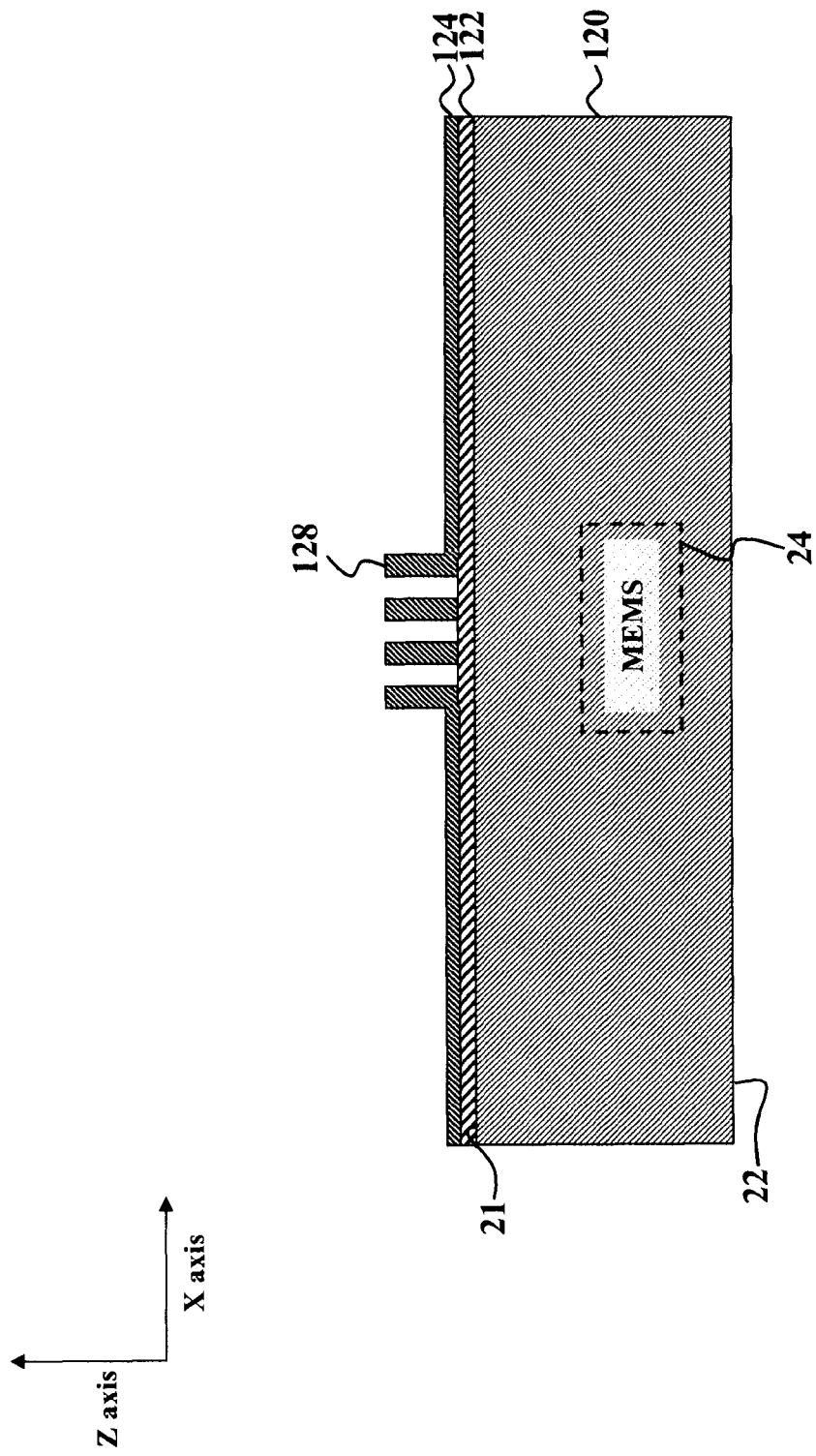
Figure 13:
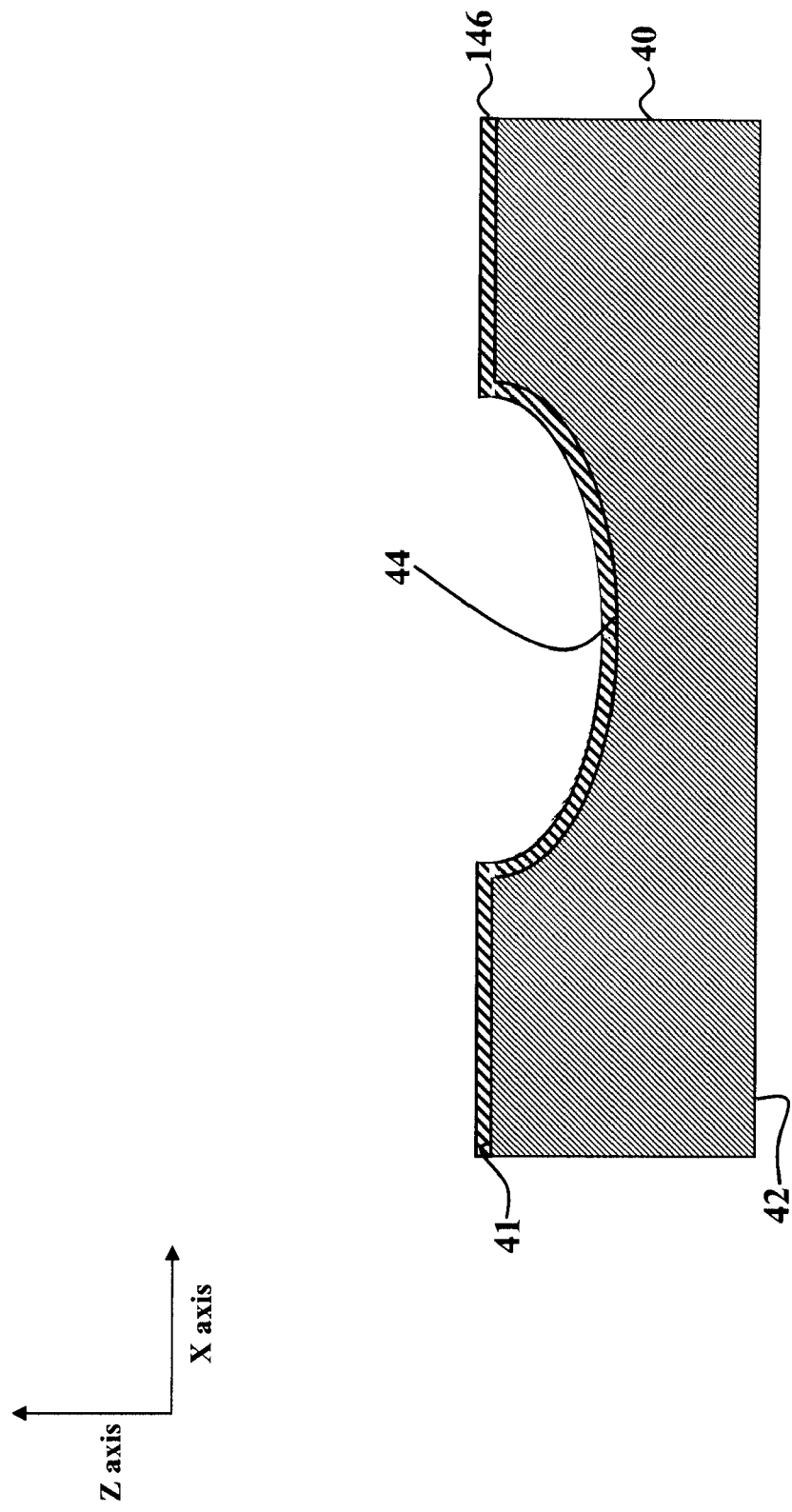

FIGS. 11, 12, and 13 are each a sectional side view showing a portion of the integrated circuit 100 at respective different stages during fabrication. With reference to FIGS. 11, 12, and 13, an explanation is now provided of a method for fabricating the integrated circuit 100. The embodiment of FIGS. 11-13 is similar in many respects to the embodiment of FIGS. 6-8. Accordingly, equivalent parts are identified by the same reference numerals, and the following discussion focuses primarily on the differences.

Referring to FIGS. 11 and 12, a lift-off process is performed to form the projections 128. More specifically, with reference to FIG. 11, the buffer layer 122 is formed over the top surface 21 of the substrate 120 by a thermal oxidation process. The buffer layer 122 could alternatively be formed by other processes. A photoresist layer of a known material is then formed over the buffer layer 122 to a thickness of about 100 μm. The photoresist layer is patterned in a known manner to leave multiple temporary photoresist projections 170 extending from the buffer layer 122. The photoresist projections 170 form an inverse pattern.

The conductive layer 124 is formed over the buffer layer 122 and photoresist projections 170 by an electroplating process. The conductive layer 124 contacts the buffer layer 122 and fills in openings between the photoresist projections 170. With reference to FIG. 12, the photoresist projections 170 are subsequently removed (for example, by washing away the photoresist material with a solvent). The portion of the conductive layer 124 that overlies the photoresist projections 170 is also removed. This provides the conductive layer 124 with the projections 128. Alternatively, a chemical mechanical polishing (CMP) process could be performed on the conductive layer 124 until the photoresist projections 170 are exposed, and then the exposed photoresist projections 170 could be removed (for example, by an etching process or an ashing process).

Referring to FIG. 13, the substrate 40 is provided, beginning with a thickness of about 725 μm. The substrate 40 could begin with other thicknesses. The substrate 40 is inverted in FIG. 13, such that the bottom surface 41 is on the top and the top surface 42 is on the bottom. Similar to the method discussed in association with FIG. 7, the substrate 40 is patterned to form the recess surface of the substrate 40 that defines the recess 44. The bonding/barrier layer 146 is then formed over the bottom surface 41 of the substrate 40 and over the recess surface that defines the recess 44. The bonding/barrier layer 146 is formed by depositing a metal layer, such as an AlCu layer.

Referring to FIGS. 9 and 10, the substrates 120 and 40 are then coupled together with the fluid 62 disposed in the chamber 160. As noted above, in the present embodiment, the bonding/barrier layer 146 effects the coupling between the substrates 120 and 40 via eutectic bonding with the conductive layer 124. Similar to the method used to fabricate integrated circuit 10, after the substrates 120 and 40 have been coupled together, the thickness of the substrate 40 is reduced from the thickness shown in FIG. 13 to the thickness shown in FIGS. 9 and 10, for example by a wafer grinding process. The reduced thickness of the substrate 40 in FIG. 13 is about 300 μm. Further, the top surface 42 of the substrate 40 is then patterned to form the recesses 48 (FIG. 10), with projections 50 extending into the recesses 48.

Figure 14:
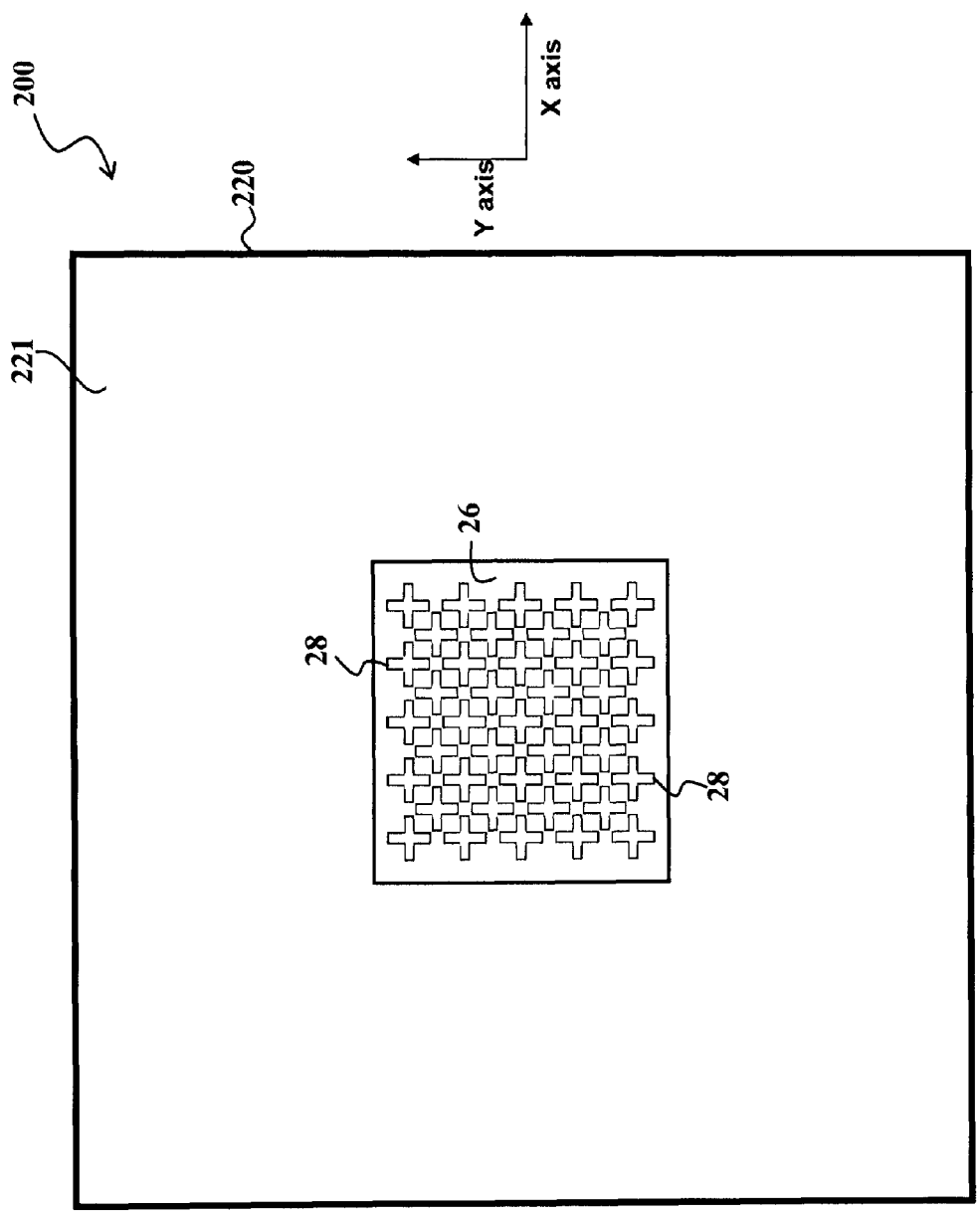
FIGS. 14, 15, and 16 are top views showing portions of an integrated circuit at different stages during fabrication, the integrated circuit being a further alternative embodiment of the integrated circuit of FIGS. 1 and 2.
Figure 15:
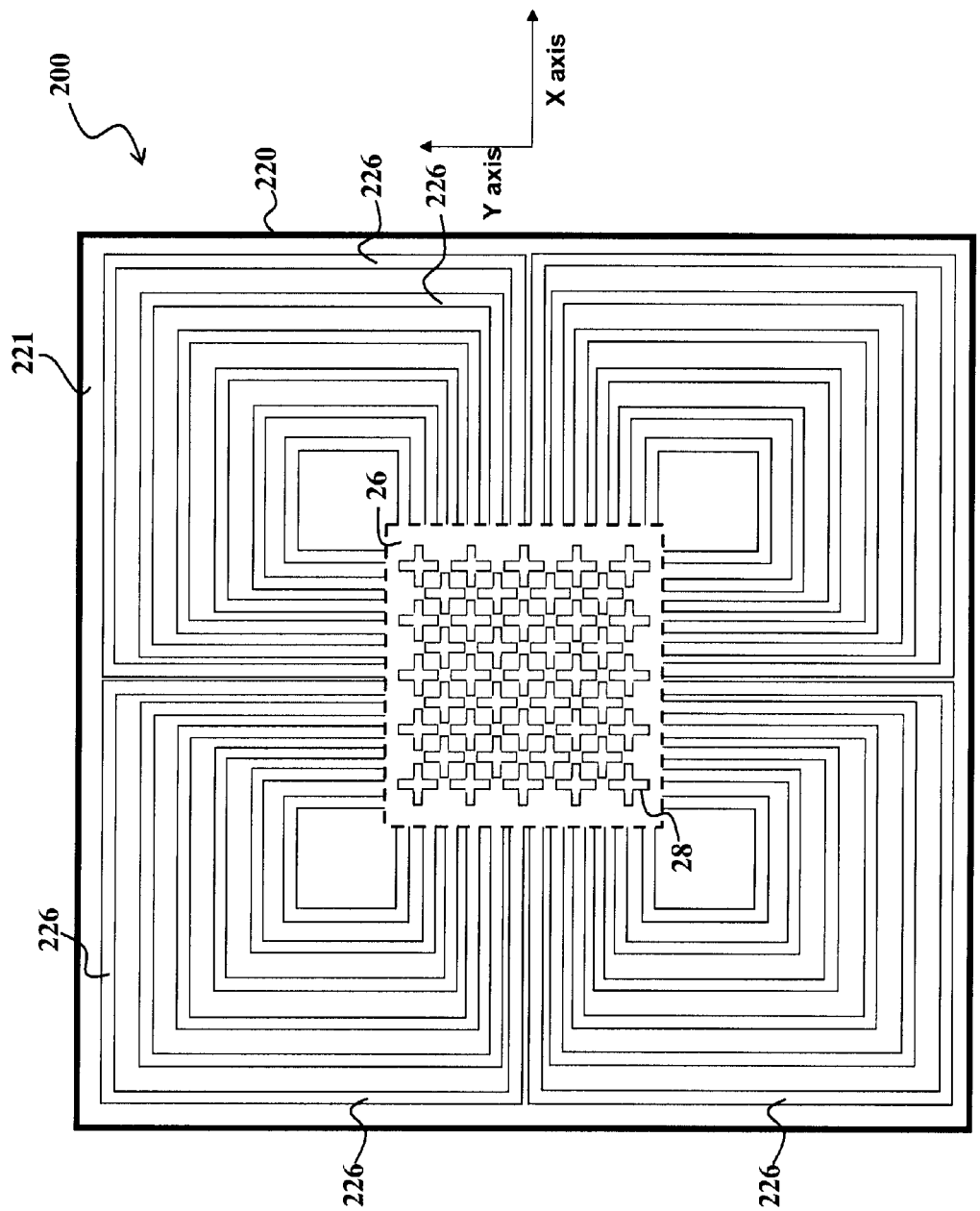
Figure 16:
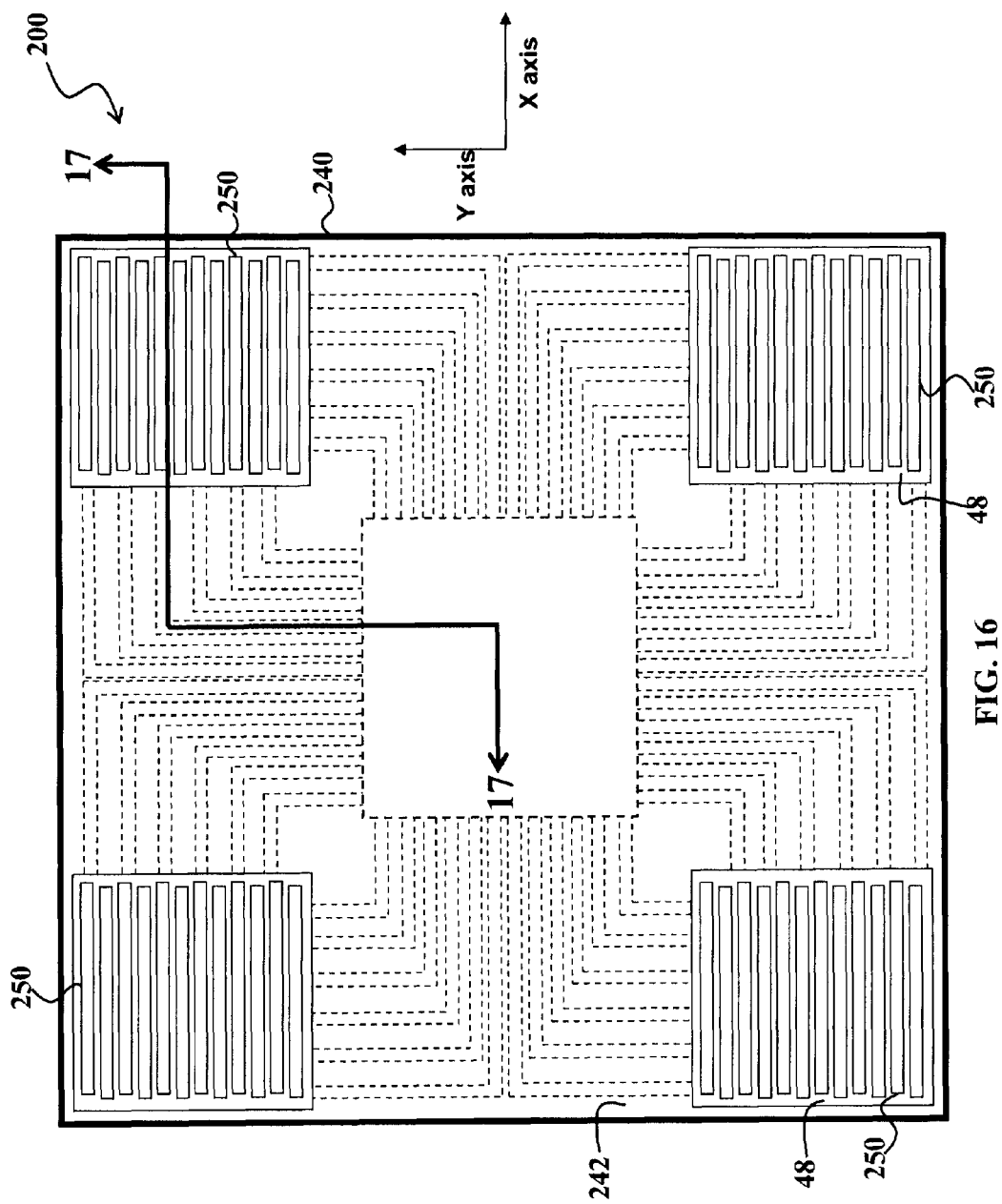

FIGS. 14, 15, and 16 are top views showing portions of an integrated circuit 200 at different stages during fabrication, the integrated circuit 200 being a further alternative embodiment of the integrated circuit 10 of FIGS. 1 and 2. With reference to FIGS. 14, 15, and 16, an explanation will now be provided of a method for fabricating the integrated circuit 200. The embodiment of FIGS. 14-16 is similar in many respects to the embodiment of FIGS. 6-8. Accordingly, the following discussion focuses primarily on the differences.

Referring to FIG. 14, a lower substrate 220 is provided and has a top surface 221. The substrate 220 is similar in many respects to the substrate 20. Similar to the method discussed in association with FIG. 6, the substrate 220 is patterned to form the recess 26 and heat transfer projections 28. The recess 26 and projections 28 are proximate to a MEMS device/electrical circuitry embedded in the substrate 220, which is not visible in FIG. 14.

Referring to FIG. 15, the substrate 220 is further patterned to form multiple grooves 226. In the disclosed embodiment, each groove 226 is an L-shaped groove. Each L-shaped groove has an outer end in that is communication with an outer end of another groove 226 and an inner end that is in communication with the recess 26. The grooves 226 could alternatively have other shapes and/or configurations.

The grooves 226 can be formed by the type of method used to form the recess 26 or the type of method used to form the recess 44 (described with reference to FIG. 7). For example, in both methods, a photoresist layer (not illustrated) of a known material is formed over the top surface 221 of the substrate 220; the photoresist layer is patterned in a known manner to form openings that expose portions of the substrate 220; and the portions of the substrate 220 that are exposed within the openings are then removed (for example, by an etching process) to form recess surfaces of the substrate 220 that define the grooves 226. The processes that form the grooves 226 are selected to achieve sloped bottom surfaces. The depth of each groove 226 gradually increases from the outer end (where the groove is in communication with the outer end of another groove 226) to the inner end (where the groove is in communication with the recess 26).

Referring to FIG. 16, an upper substrate 240 is shown on top of the lower substrate 220, and has a top surface 242. The substrate 240 is similar in many respects to the substrate 40. Similar to the method discussed in association with FIG. 6, before the substrate 240 is coupled to the substrate 220, a recess surface is formed in the bottom surface of the substrate 240 to define a recess that aligns with recess 26 of the substrate 220. Multiple grooves are also formed in the bottom surface of the substrate 240, which are similar in shape, size, and orientation to the grooves 226 of the substrate 220. A bonding/barrier layer is formed over the bottom surface of the substrate 240, the recess surface defining the recess, and the multiple grooves. The bonding/barrier layer effects the coupling of the substrates 220 and 240.

The substrate 240 is coupled to the top surface of the substrate 220. The substrates 220 and 240 are coupled by a fusion bonding process, which is similar to the fusion bonding process described above for coupling substrates 20 and 40 of integrated circuit 10. After the substrates 220 and 240 are coupled, the recess 26 and grooves 226 are adjacent the recess on the bottom surface of the substrate 240 and grooves formed in the bottom surface of the substrate, collectively forming a chamber that includes a fluid. In addition, similar to the method discussed in association with FIG. 2, the top surface 242 of the substrate 240 is subjected to a patterned etch to form recess surfaces of the substrate 240 that define recesses 48 and heat transfer projections 250. The recesses 48/projections 250 are formed proximate to the outer ends of the grooves 226. The projections 250 are similar to the projections 50, except that in the present embodiment, each projection 250 has a rectangular cross-section as illustrated in FIG. 16.

Figure 17:
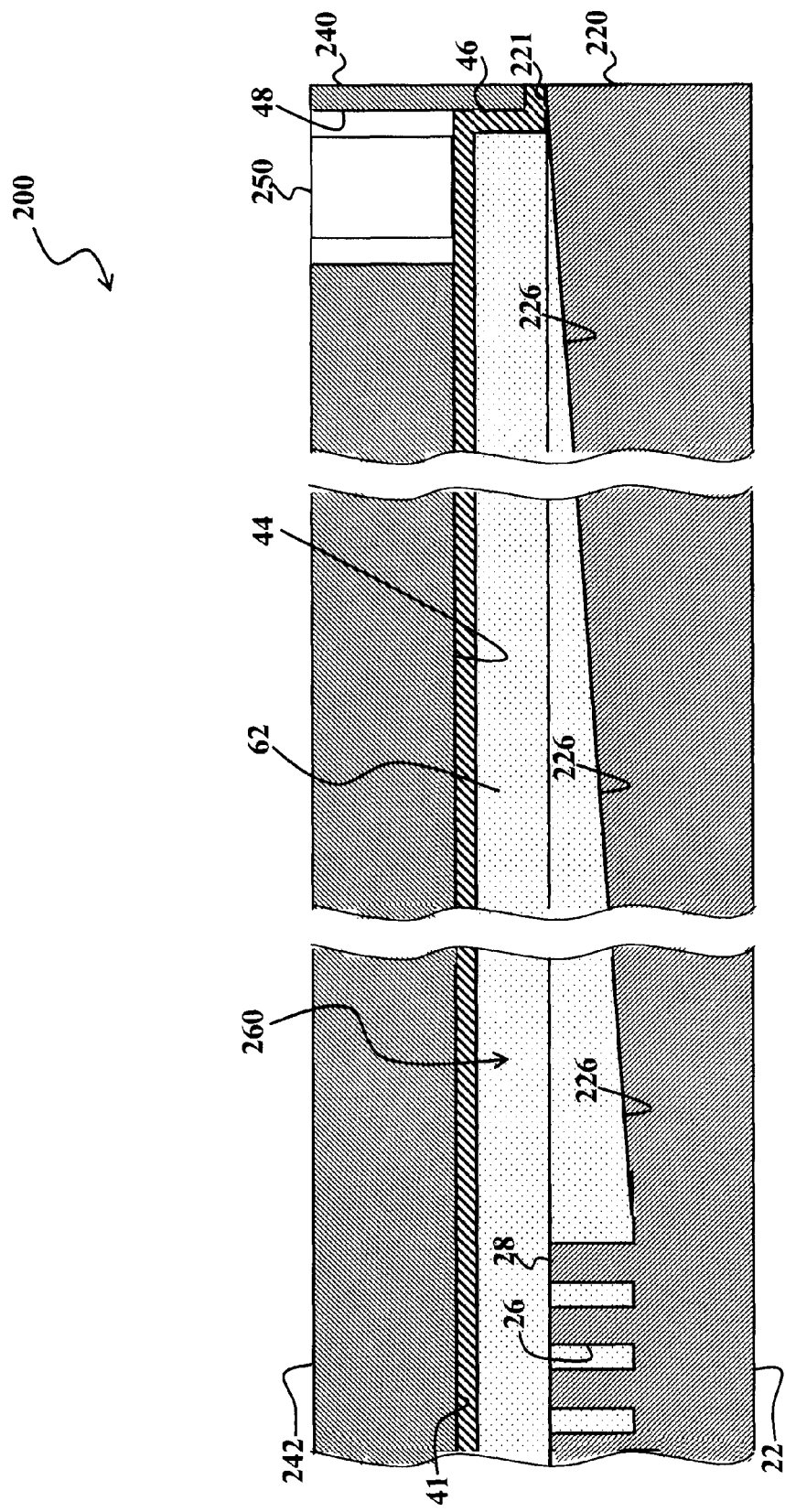
FIG. 17 is a diagrammatic sectional view of the integrated circuit taken along line 17-17 of FIG. 16.

FIG. 17 is a diagrammatic sectional view of the integrated circuit 200 taken along line 17-17 of FIG. 16, and shows a single groove 226. The other grooves 226 are similar. The following discussion focuses on the differences between the integrated circuit 200 and integrated circuit 10. In particular, the substrate 220 includes a recess surface that defines the groove 226. The recess surface that defines the groove 226 has a sloped bottom surface that merges into the bottom surface of the recess 26. Also, when the substrate 220 is coupled to the substrate 240, the recess 26, groove 226, recess 44, and groove in substrate 240 are adjacent and collectively form a portion of a chamber 260 that contains the fluid 62.

The operation of the integrated circuit 200 is similar in many respects to the operation of the integrated circuit 10. The integrated circuit 200 provides for transfer of heat within the integrated circuit 200. Heat is generated in the substrate 220 (for example, by microelectronic elements and/or mechanical movement within a MEMS device). This generated heat within the substrate 220 flows to the recess 26, including the projections 28 in the recess 26. The fluid 62 contacts portions of the projections 28, and due to a temperature difference between the projections 28 and fluid 62, heat flows from the projections 28 to the fluid 62. Accordingly, the fluid 62 that is in the liquid state in the recess 26 absorbs heat from the projections 28 and changes from the liquid phase to the gas phase.

The portion of the fluid 62 in the gas phase flows from the recess 26 through the chamber 160 to portions of the chamber 160 that are proximate to the recesses 48 in the substrate 240. Here, the fluid 62 that is in the gas phase releases heat through the bonding/barrier layer 46. The released heat flows through the bonding/barrier layer 46 and then flows out of the integrated circuit 20 through the recesses 48. The released heat also flows from the bonding/barrier layer 46 to the projections 250 and then out of the integrated circuit 10 through the recesses 48.

Upon release of this heat, the fluid 62 condenses and thus changes from the gas phase to the liquid phase. In the present embodiment, after releasing heat, the condensed fluid 62 in the liquid phase flows along groove 226 back toward the recess 26. Because the recess 226 is shallower where heat is released, the fluid 62 in the liquid phase naturally flows "downhill" (for example, by gravity) from the shallower depth to the deeper depth of groove 226 and into recess 26. Similar to integrated circuit 10, the fluid 62 cyclically changes between the liquid and gas phases as it absorbs and releases heat within the integrated circuit 200. In addition, the chamber 260 and fluid 62 of integrated circuit 200 effectively define a heat pipe within the integrated circuit 200, transferring heat away from heat generating portions of the substrate 220.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    an integrated circuit including a heat generating portion, a heat absorbing portion spaced from the heat generating portion, and heat transfer structure that transfers heat from the heat generating portion to the heat absorbing portion, wherein the heat transfer structure includes:
    a chamber extending between the heat generating and heat absorbing portions;
    a fluid disposed within the chamber and having first and second phases that are different, the fluid having a first phase change characteristic where a change from the first phase to the second phase occurs upon heat absorption from the heat generating portion, and having a second phase change characteristic where a change from the second phase to the first phase occurs upon release of heat to the heat absorbing portion, and
    a heat transfer projection that extends into the chamber at the heat generating portion.

2. An apparatus according to claim 1, wherein the heat transfer projection includes one of silicon and metal.

3. An apparatus according to claim 1, wherein the heat absorbing portion includes a recess being free of communication with the chamber and having a portion that is proximate to the chamber, such that heat flows from the chamber to the recess.

4. An apparatus according to claim 3, wherein the heat transfer structure includes a heat transfer projection that extends into the recess of the heat absorbing portion.

5. An apparatus according to claim 1, wherein the first phase is a liquid phase and the second phase is a gas phase.

6. An apparatus according to claim 1, wherein the heat generating portion includes a MEMS device.

7. An apparatus according to claim 1, wherein the integrated circuit includes a first substrate and a second substrate coupled together, the heat transfer structure having a portion located at an interface of the first and second substrates.

8. An apparatus according to claim 7, wherein one of the first and second substrates includes a recess at the interface, the chamber including the recess.

9. An apparatus according to claim 8,
    wherein the one of the first and second substrates that includes the recess has a surface that defines a portion of the recess; and
    including a barrier layer on the surface.

10. An apparatus according to claim 7, wherein the heat transfer structure includes a heat transfer projection that extends from one of the first and second substrates into a portion of the chamber at the heat generating portion.

11. An apparatus according to claim 10, wherein the heat transfer projection includes one of silicon and metal.

12. An apparatus according to claim 7, wherein the heat absorbing portion includes a recess in one of the first and second substrates, the recess being free of communication with the chamber and having a portion that is proximate to the chamber, such that heat flows from the chamber to the recess.

13. An apparatus according to claim 12, wherein the heat transfer structure includes a heat transfer projection that extends into the recess of the heat absorbing portion.

14. An apparatus according to claim 7, wherein the integrated circuit includes a bonding layer between and in contact with portions of the first and second substrates, the bonding layer effecting the coupling of the first and second substrates.

15. An apparatus according to claim 7, wherein the first and second substrates are coupled together by one of a fusion bond and a euctectic bond.

16. A method of operating an integrated circuit that includes a heat transfer structure having a chamber that has a fluid disposed therein and that extends between a heat generating portion and a heat absorbing portion, the method comprising:
    absorbing heat into the fluid from a heat transfer projection that extends into the chamber at the heat generating portion, the fluid changing from a first phase to a second phase different from the first phase when the heat is absorbed; and
    releasing heat from the fluid to the heat absorbing portion, the fluid changing from the second phase to the first phase when the heat is released.

17. A method according to claim 16, wherein the fluid changing from the first phase to the second phase includes the fluid changing from a liquid phase to a gas phase, and the fluid changing from the second phase to the first phase includes the fluid changing from the gas phase to the liquid phase.

18. A method comprising:
    forming a first structure on a first part;
    forming a second structure on a second part;
    bonding the first and second parts to form a portion of an integrated circuit, such that the first and second structures are adjacent and collectively form a chamber within the integrated circuit;
    forming a heat generating portion and a heat absorbing portion in the integrated circuit, the heat generating and heat absorbing portions being spaced from each other and each being proximate to the chamber; and
    introducing into the chamber a fluid having first and second phases that are different, the fluid having a first phase change characteristic where a change from the first phase to the second phase occurs upon heat absorption from the heat generating portion, and having a second phase change characteristic where a change from the second phase to the first phase occurs upon release of heat to the heat absorbing portion.

19. A method according to claim 18, wherein one of the forming the first structure and forming the second structure includes forming a heat transfer projection that extends into the chamber and that engages the fluid.

20. A method according to claim 19, wherein the forming the heat transfer projection includes etching a recess in a portion of one of the first part and the second part, the chamber including the recess.

21. A method according to claim 18, wherein one of the forming the first structure and forming the second structure includes forming a recess, the chamber including the recess.

22. A method according to claim 18, wherein the forming the heat absorbing portion includes forming a recess in one of the first and second parts, the recess being free of communication with the chamber and having a portion that is proximate to the chamber.

* * * * *